(12) United States Patent
Yang et al.

(10) Patent No.: US 9,760,001 B2
(45) Date of Patent: Sep. 12, 2017

(54) MANUFACTURING METHOD OF COLOR FILTER SUBSTRATE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Zerong Yang, Beijing (CN); Qingde Long, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 240 days.

(21) Appl. No.: 14/429,443

(22) PCT Filed: Jun. 30, 2014

(86) PCT No.: PCT/CN2014/081222
§ 371 (c)(1),
(2) Date: Mar. 19, 2015

(87) PCT Pub. No.: WO2015/035819
PCT Pub. Date: Mar. 19, 2015

(65) Prior Publication Data
US 2015/0248051 A1 Sep. 3, 2015

(30) Foreign Application Priority Data
Sep. 10, 2013 (CN) .......................... 2013 1 0409241

(51) Int. Cl.
*G02B 5/20* (2006.01)
*G03F 7/00* (2006.01)
*G03F 7/20* (2006.01)
*G02F 1/1335* (2006.01)

(52) U.S. Cl.
CPC ............ *G03F 7/0007* (2013.01); *G02B 5/201* (2013.01); *G02F 1/133516* (2013.01); *G03F 7/2024* (2013.01); *G03F 7/2032* (2013.01)

(58) Field of Classification Search
CPC .... G03F 7/0007; G03F 7/2022; G03F 7/2024; G03F 7/203; G03F 7/2032; G02B 5/201; G02B 5/223; G02F 1/133514; G02F 1/133516
USPC .............................................. 430/7; 349/106
See application file for complete search history.

(56) References Cited

U.S. PATENT DOCUMENTS

| | | | |
|---|---|---|---|
| 2004/0201812 A1 | 10/2004 | Chu et al. | |
| 2007/0065571 A1 | 3/2007 | White et al. | |
| 2007/0099094 A1* | 5/2007 | Nemoto | G02B 5/223 430/7 |
| 2010/0040963 A1* | 2/2010 | Kanna | G02B 5/201 430/7 |
| 2013/0093982 A1 | 4/2013 | Kuroda et al. | |

FOREIGN PATENT DOCUMENTS

| | | | |
|---|---|---|---|
| CN | 101114035 A | | 1/2008 |
| CN | 101533180 A | | 9/2009 |
| CN | 101551481 A | | 10/2009 |
| CN | 102707495 A | | 10/2012 |
| CN | 103033984 A | | 4/2013 |
| JP | 10-213910 A | * | 8/1998 |
| JP | 10213910 A | | 8/1998 |
| JP | 2002-090539 A | | 3/2002 |
| JP | 2005-255957 A | * | 9/2005 |

OTHER PUBLICATIONS

Computer-generated translation of JP 2005-255957 (Sep. 2005).*
Computer-generated translation of JP 10-213910 (Aug. 1998).*
First Chinese Office Action dated Sep. 28, 2016; Appln. No. 201310409241.7.
International Search Report mailed Oct. 15, 2014; PCT/CN2014/081222.
Written Opinion of the International Searching Authority mailed Oct. 15, 2014; PCT/CN2014/081222.
The Second Chinese Office Action dated Jun. 12, 2017; Appln No. 201310409241.7.

* cited by examiner

*Primary Examiner* — John A McPherson
(74) *Attorney, Agent, or Firm* — Ladas & Parry LLP

(57) ABSTRACT

A manufacturing method of a color filter substrate includes: depositing a photoresist layer on a substrate, patterning the photoresist layer through exposure and development and executing an UV curing; or forming an overcoat whose material is a light-cured material on a substrate, conducting an UV irradiation on the substrate from front and back sides of the substrate, respectively; or, depositing a black matrix photoresist, a red photoresist, a green photoresist and a blue photoresist on a substrate, respectively, and forming corresponding patterns respectively through exposure and development and executing an UV curing. By the technical solution, the line-width of a BM can be restrained from broadening, and the curing time can be shortened, thereby raising the production efficiency.

17 Claims, 3 Drawing Sheets

MANUFACTURING METHOD OF COLOR FILTER SUBSTRATE

TECHNICAL FIELD

Embodiments of the present invention relate to a manufacturing method of a color filter substrate.

BACKGROUND

Currently, during manufacture of a color filter (CF) substrate, each of a black matrix (BM), red, green and blue (R, G, B) sub-pixels and pillar-shaped spacers (PS) is formed by way of post-curing, e.g., heat curing, after development. It is required for high-resolution display panels to have a smaller line-width of the black matrix, which is fabricated by using a photoresist after being subjected to spin-coating, exposure and development. The black matrix structure obtained by fabrication is shown in FIG. 1, and a black matrix 1 appears to be an inverted trapezoidal structure as a whole, which is hard in top and soft in low. When a post-curing process such as heat curing is executed, photoresist (i.e., PR) is heated to soften and flows downward, which will cause line-width of the BM 1 become broad, as shown in FIG. 2, and requirements for high-resolution display panels cannot be met. Moreover, the requisite time period for heat curing is longer, and the production efficiency is low.

For the sake of solving the above issue that the BM line-width broadens, it is possible to use an existing back exposure technique to strengthen the curing of the PR in the lower part of a BM, so as to maintain the inverted trapezoidal structure formed after development. However, the structure may still deform after it is baked with heat, causing the BM line-width broaden, and thus the issue that the BM line-width broadens cannot be solved nicely.

SUMMARY

According to an embodiment of the present invention, there is provided a manufacturing method of a color filter substrate, capable of restraining the line-width of a BM from broadening, and capable of shortening the curing time.

According to an embodiment of the invention, there is provided a manufacturing method of a color filter substrate, which may include coating photoresist on a substrate to form a photoresist layer, patterning the photoresist layer by exposure and development and executing an ultraviolet curing of the photoresist layer.

For example, patterning the photoresist layer and executing the ultraviolet curing of the photoresist layer may include, in case that the photoresist layer is a black matrix photoresist layer, after formation of a pattern of a black matrix, conducting an ultraviolet irradiation on the substrate from front and back sides of the substrate, respectively.

For example, patterning the photoresist layer and executing the ultraviolet curing of the photoresist layer may include, in case that the photoresist layer is a red photoresist layer, after formation of a pattern of a red sub-pixel, conducting an ultraviolet irradiation on the substrate from front and back sides of the substrate, respectively.

For example, patterning the photoresist layer and executing the ultraviolet curing of the photoresist layer may include, in case that the photoresist layer is a green photoresist layer, after formation of a pattern of a green sub-pixel, conducting an ultraviolet irradiation on the substrate from front and back sides of the substrate, respectively.

For example, patterning the photoresist layer and executing the ultraviolet curing of the photoresist layer may include, in case that the photoresist layer is a blue photoresist layer, after formation of a pattern of a blue sub-pixel, conducting an ultraviolet irradiation on the substrate from front and back sides of the substrate, respectively.

For example, patterning the photoresist layer and executing the ultraviolet curing of the photoresist layer may include, in case that the photoresist layer is a photoresist layer for pillar-shaped spacers, after formation of a pattern of the pillar-shaped spacers, conducting an ultraviolet irradiation on the substrate from front and back sides of the substrate, respectively.

In at least an embodiment, the ultraviolet curing may be carried out in a conveyor belt ultraviolet curing machine or an oven ultraviolet curing machine.

In at least an embodiment, when the conveyor belt ultraviolet curing machine is used for ultraviolet curing of the substrate, the transfer speed, the curing time and the length of an ultraviolet curing segment may meet the following relationship: the transfer speed=the length of the UV curing segment/the curing time.

In at least an embodiment, the oven ultraviolet curing machine may be provided in a multilayered structure, and at least one ultraviolet light source is arranged between layers.

In at least an embodiment, the photoresist may have a photosensitizer sensitive to i-line of ultraviolet light added therein.

In at least an embodiment, the photoresist may also have a photosensitizer sensitive to h-line or g-line of ultraviolet light added therein.

According to an embodiment of the invention, there is further provided a manufacturing method of a color filter substrate, which may include, coating a light-cured material on a substrate to form an overcoat, and executing an ultraviolet curing.

For example, the ultraviolet curing may include, conducting an ultraviolet irradiation on the substrate from front and back sides of the substrate, respectively.

In at least an embodiment, the ultraviolet curing may be carried out in a conveyor belt ultraviolet curing machine or an oven ultraviolet curing machine.

In at least an embodiment, when the conveyor belt ultraviolet curing machine is used for ultraviolet curing of the substrate, a transfer speed, a curing time period and a length of an ultraviolet curing segment meet the following relationship: the transfer speed =the length of the UV curing segment/the curing time.

In at least an embodiment, the oven ultraviolet curing machine may be provided in a multilayered structure, and at least one ultraviolet light source is arranged between layers.

In at least an embodiment, the light-cured material may have a photosensitizer sensitive to i-line of ultraviolet light added therein.

In at least an embodiment, the light-cured material may also have a photosensitizer sensitive to h-line or g-line of ultraviolet light added therein.

According to an embodiment of the invention, there is further provided a manufacturing method of a color filter substrate, which may include, coating a black matrix photoresist on a substrate to form a black matrix photoresist layer, forming a pattern of a black matrix through exposure and development and executing an ultraviolet curing of the black matrix photoresist layer; coating a red photoresist on the substrate to form a red photoresist layer, forming pattern of red sub-pixels through exposure and development and executing an ultraviolet curing of the red photoresist layer;

coating a green photoresist on the substrate to form a green photoresist layer, forming pattern of green sub-pixels through exposure and development and executing an ultraviolet curing of the green photoresist layer; coating a blue photoresist on the substrate to form a blue photoresist layer, forming pattern of blue sub-pixels through exposure and development and executing an ultraviolet curing of the blue photoresist layer.

In at least an embodiment, the method may further include, coating a light-cured material on the substrate to form an overcoat, and executing an ultraviolet curing.

In at least an embodiment, the method may further include, coating a pillar-shaped spacer photoresist on the substrate to form a photoresist layer for pillar-shaped spacers, forming a pattern of the pillar-shaped spacers and executing an ultraviolet curing.

In at least an embodiment, the method may further include, conducting an annealing on the substrate with the black matrix, the red, green and blue sub-pixels, the overcoat and the pillar-shaped spacers formed thereon.

In at least an embodiment, the ultraviolet curing may be conducting an ultraviolet irradiation on the substrate from front and back sides of the substrate, respectively.

In at least an embodiment, the ultraviolet curing may be carried out in a conveyor belt ultraviolet curing machine or an oven ultraviolet curing machine.

In at least an embodiment, when the conveyor belt ultraviolet curing machine is used for ultraviolet curing of the substrate, the transfer speed, the curing time and the length of an ultraviolet curing segment may meet the following relationship: the transfer speed=the length of the UV curing segment/the curing time.

In at least an embodiment, the oven ultraviolet curing machine may be provided in a multilayered structure, and at least one ultraviolet light source is arranged between layers.

In at least an embodiment, at least one of the black matrix photoresist, the red photoresist, the green photoresist, the blue photoresist, the light-cured material and the pillar-shaped spacer photoresist may have a photosensitizer sensitive to i-line of ultraviolet light added therein.

In at least an embodiment, at least one of the black matrix photoresist, the red photoresist, the green photoresist, the blue photoresist, the light-cured material and the pillar-shaped spacer photoresist may also have a photosensitizer sensitive to h-line or g-line of ultraviolet light added therein.

In the manufacturing method of the color filter substrate provided by at least an embodiment of the invention, after patterns of a black matrix, red, green and blue sub-pixels and pillar-shaped spacers are formed on a substrate, respectively, an ultraviolet irradiation is conducted on the substrate from front and back sides of the substrate, respectively. Because softening and collapsing of a photoresist will not be brought about by an UV curing mode of the invention, an inverted trapezoidal structure of BM is maintained. Thus, the BM line-width can be restrained from becoming larger, thereby fitting a narrow line-width requirement of a high-resolution display panel on BM, and the aperture ratio can also be raised.

According to embodiments the invention, by means of changing a heat curing mode adopted in a post-curing process into an UV curing way, not only the time in which a photolithography procedure is executed is shortened, but also the color filter substrate is effectively assured of not being polluted by various volatile substances during its manufacture. Consequently, quality of the color filter substrate can be better guaranteed.

DETAILED DESCRIPTION

Figure 1:
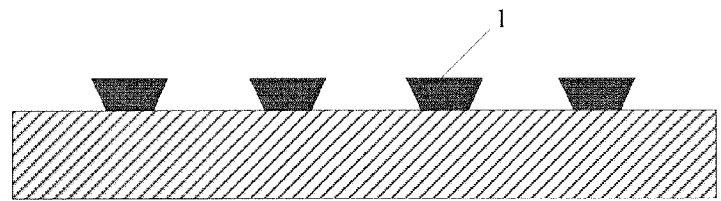
FIG. 1 is a structure section view illustrating a black matrix (BM) after subjected to development and etching while before post-cured.
Figure 2:
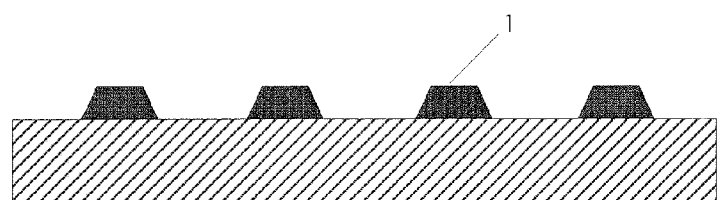
FIG. 2 is a structure section view illustrating a BM after subjected to a post-curing process such as heat curing.

UV curing technology comprises been widely applied to painting, semiconductor and other industries by virtue of its traits of high throughput and pollution-free, and the film forming property after curing is excellent. In embodiments of the invention, a traditional post-curing process is changed from a heat curing method to an UV curing method, and by employing the UV curing method to manufacturing processes of a black matrix (BM), RGB sub-pixels and so on, the line-width for each can become more uniform, and line-width of a BM can be prevented from becoming larger, and phenomena of light leakage and color mixing caused by uneven line-width can be effectively reduced, thereby improving the resolution.

Embodiments of the invention will be further described in detail in conjunction with drawings and specific embodiments.

A manufacturing method of a color filter substrate according to an embodiment of the invention may include the following steps.

Step 1, a layer of a BM photoresist is formed on a substrate, and subjected to a patterning process to form a pattern of the BM. After that, the substrate is irradiated with UV light from the front and back sides of the substrate on which the BM is formed, so as to accomplish the curing process of the BM. The curing process may be executed in an UV curing machine, such as a conveyer belt UV curing machine or an oven UV curing machine. Please see descriptions of concrete embodiments for details.

The front and back sides of the substrate are each irradiated with UV light, so that the light resistant effect of the photoresist against UV light when a single side is irradiated with UV light can be refrained. Thus, the energy of UV light that can be irradiated into the inside of the photoresist is increased, and it is ensured that the color filter substrate subjected to UV curing comprises physical and chemical properties comparable to those of a color filter substrate subjected to a traditional heat curing.

Step 2, photoresist for red (R), green (G) and blue (B) sub-pixels are successively deposited on the substrate, and are subjected to patterning processes so as to form corresponding patterns of the R, G and B sub-pixels. After that, the substrate is irradiated with UV light from the front and back sides of the substrate, respectively, so as to accomplish the curing process of the R, G and B sub-pixels.

For example, the method may further include the following steps:

Step 3: a photoresist for pillar-shaped (post) spacers is successively deposited on the substrate, and is subjected to exposure, development and other for a patterning process, so as to form the pattern of the pillar-shaped spacers. After that, the substrate is irradiated with UV light from the front and back sides of the substrate, respectively, so as to accomplish curing process of the pillar-shaped spacers.

Optionally, between the step 2 and the step 3, the method may further include: irradiating the substrate with UV light from front and back sides of the substrate, respectively, after an overcoat (OC) is formed on the substrate by coating a light-cured material.

For example, after the substrate on which R, G and B sub-pixels are formed is subjected to UV curing, an overcoat is formed by a process including substrate cleaning, coating of a light-cured material, and soft-baking. After that, the substrate is irradiated with UV light from the front and back sides of the substrate, respectively.

It is to be noted that, among OC producing methods, there are light-curing methods, and there are also heat curing methods, which mainly depend on the material used for the overcoat. A material of the overcoat can be classified into the following two categories. One of them is a thermosetting OC resin, and the initiator used for the resin is a thermo-sensitive initiator, which is not sensitive to ultraviolet light, and is not suitable for light-curing methods; and the other one is a light-cured OC resin, and the initiator used for the resin is a photosensitive initiator, which is not only suitable for light-curing, but also suitable for heat curing. The light-cured OC resin is mainly designed for a light-curing mode OC process, and the light-cured OC resin is not in a heat curing mode in general. Production of OC in a color filter substrate of a traditional TFT-LCD basically adopts a heat curing mode, but because a light-cured OC resin comprises been successfully developed as of now, an UV curing method can be used for an OC curing process in a color filter substrate as long as an UV curing machine and the light-cured OC resin are introduced.

Optionally, the method may further include conducting an anneal process on the substrate with the black matrix, red, green and blue sub-pixels, the overcoat and pillar-shaped spacers formed thereon, so as to eliminate thermal stresses inside R, G and B sub-pixels and the post spacers, and to ensure their normal morphologies. In addition, the photoresist may also be cured thoroughly, so as to enhance the high-temperature resistance performance of the photoresist.

Softening and collapsing of the photoresist will not be caused by the UV curing way of the present embodiment, so that an inverted trapezoid structure of BM can be maintained. Thus, the line-width of BM can be restrained from becoming larger, thereby fitting a narrow line-width requirement of a high-resolution display panel on BM, and the curing time can be shortened.

Method of the invention will be described below in detail in combination with concrete embodiments.

Embodiment 1: UV Curing with a Conveyer Belt UV Curing Machine

In the embodiment, the method of UV curing employed in embodiments of the invention and its principle will be described with a BM photoresist (the model of which is BK-410) produced by DONGWOO FINE-CHEM as an example. A substrate coated with a photoresist layer goes through an existing exposure machine after it is dried under a decompressed vacuum circumstance and soft-baked on a hot plate, and the UV light emitted by the exposure machine after an aligned process is conducted irradiates onto a front side of the substrate for a short time period. The photosensitive initiator in a negative photoresist is decomposed due to the action of UV light so as to generate activated free radicals, which induce a crosslinking reaction in the photoresist, so that the photoresist is not dissolved by a developing liquid, and the desired pattern can be formed. For the exposure process, due to the short time period (usually being 5 s to 6 s) and the blocking action of the photoresist against light, the photosensitive initiator in the photoresist (especially that close to the substrate) will not be consumed completely, and the remaining photosensitive initiator in the photoresist provides active free radicals for a post-curing process after development, so as to guarantee the conduction of the post-curing process. A majority of the photosensitive initiator in the photoresist not only can be decomposed under the irradiation of UV light, but also can be decomposed under action of heat, and therefore, for the post-curing procedure, not only a heat curing process can be used, but also an UV curing process can be used.

Figure 3:
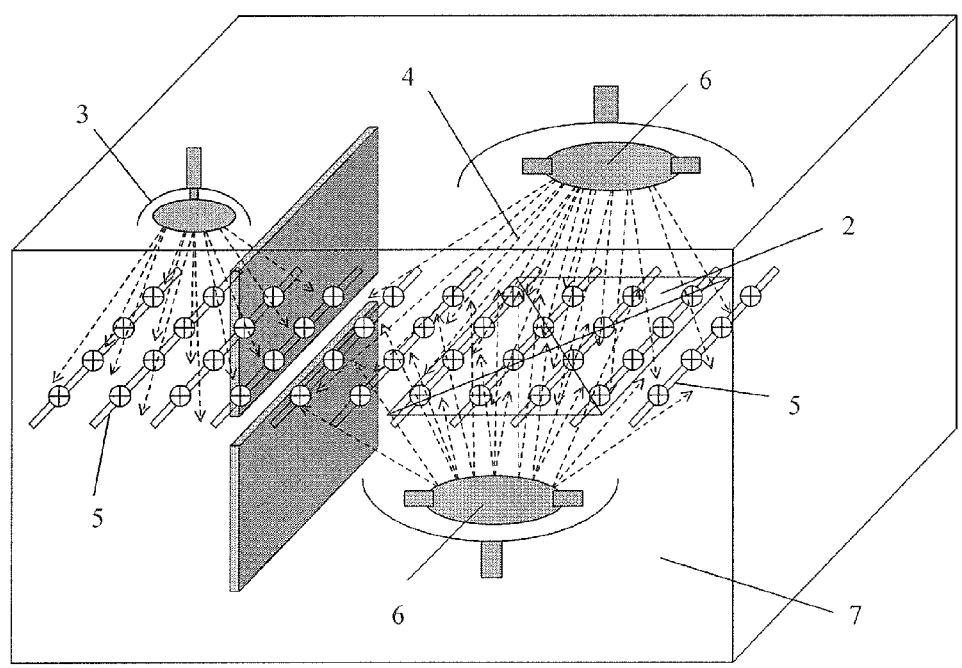
FIG. 3 is a structure view illustrating a conveyer belt UV curing machine according to embodiment 1 of the invention.
Figure 4:
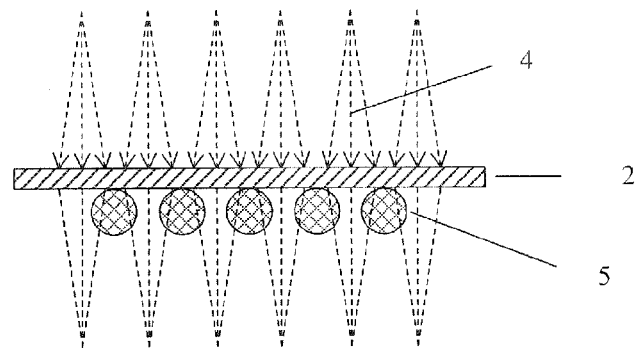
FIG. 4 is a partial structure view illustrating irradiation of a substrate with a UV light according to embodiment 1 of the invention.

The UV curing method described here may employ the conveyer belt UV curing machine 7 as shown in FIG. 3. After a substrate 2 enters the UV curing machine, the substrate 2 is preheated and the film surface is planarized by an infrared heating unit 3 provided at an entrance unit, and after the substrate 2 subjected to infrared preheating goes through a transfer device 5, which is provided with irradiation of UV light 4 for each of front and back sides of it, it can be cured with UV light. A partial structure view of irradiation of UV light on the substrate 2 is shown in FIG. 4. The transfer speed of the substrate and the uniformity of transfer speed may be controlled by the transfer device 5. The time period of UV curing may be controlled by controlling transfer speed of the UV curing machine, so as to control the curing degree. Each of front and back sides of the substrate 2 is irradiated by UV light emitted from an ultraviolet light source 6 during its transferring, so that a light resistant effect of the photoresist against UV light when a single side is irradiated with UV light can be refrained. Thus, the energy of UV light irradiated into the inside of the photoresist can be increased, and it is ensured that the color filter substrate subjected to UV curing comprises physical and chemical properties comparable to those of a color filter substrate subjected to a traditional heat curing.

The color filter substrate is cured by adopting an UV light full-exposure mode, and the curing time can be adjusted according to the solidifying effect. Like an existing selective method of the exposure energy for an exposure machine, the curing degree should be determined according to the requirements of physical and chemical properties on a film layer, and then the needed curing time is determined according to the illuminance of an ultraviolet light source of an UV curing machine. The curing time is then converted into the transfer speed of a conveyor belt of the UV curing machine, that is, the transfer speed=the length of an UV curing segment/the curing time.

The length of the UV curing segment is the length of an UV irradiation region, and concretely corresponds to the length of a conveyor belt of an UV irradiation zone in a conveyor belt UV curing machine.

Embodiment 2: UV Curing with an Oven UV Curing Machine

The same BM photoresist as that in Embodiment 1 is employed in the present embodiment, development and etching of BM in a color filter substrate and the processes prior to them are the same as those in Embodiment 1, and an UV light full-exposure is still employed after development.

Figure 5:
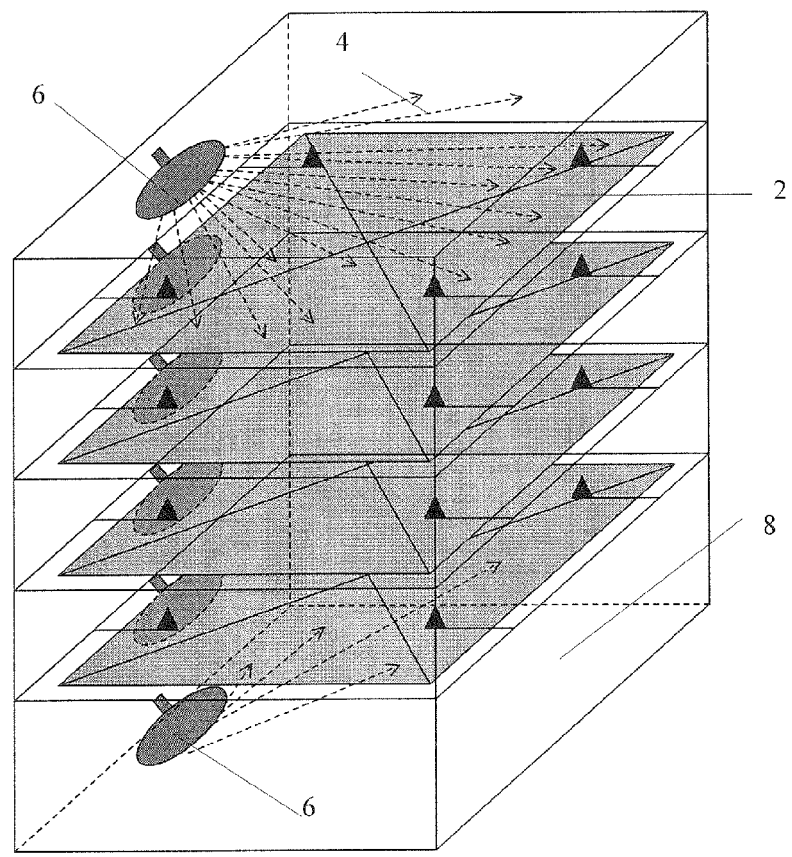
FIG. 5 is a structure view illustrating an oven UV curing machine according to embodiment 2 of the invention.

In the embodiment, an oven UV curing machine 8 shown in FIG. 5 which is similar to an existing roasting furnace. The curing machine 8 may be provided in a multilayered structure, and in order to ensure uniformity of UV irradiation, at least one UV light source 6 is arranged between layers, and useful for UV irradiation of the front and back sides of the substrate, respectively. Because the UV light full-exposure method is fast and clean, and comprises a short curing time period, it is unnecessary to have too many segments on the premise of satisfying the production rhythm. Taking a four-layered structure as an example, FIG. 5 shows the structure and curing method of an oven UV curing machine, but the embodiments of the invention are obviously not limited to this.

Embodiment 3: UV Curing with a Modified Photoresist

The same BM photoresist as that in Embodiment 1 is employed in the present embodiment. A conveyor belt UV curing machine or an oven UV curing machine may be chosen for the curing apparatus for execution of UV curing. In order to enhance the solidifying effect, modification to components of an initiator is made to the photoresist in the embodiment. Color-filter exposure machines at present basically employ i-line of ultraviolet light, the corresponding wavelength of which is $\lambda=365$ nm, and so a photosensitive initiator in a photoresist is also a photosensitizer sensitive to i-line. In the present embodiment, in order that an UV light full-exposure after development is used, a photosensitizer sensitive to i-line is added to the photoresist, and a photosensitizer sensitive to other waveband (e.g., h-line, the corresponding wavelength of which is $\lambda=405$ nm; or g-line, the corresponding wavelength of which is $\lambda=436$ nm) of UV light is introduced in addition. The photosensitizer sensitive to i-line may use 2,2-dimethoxy-2-phenyl acetophenone, the photosensitizer sensitive to h-line may use thioxanthone, and the photosensitizer sensitive to g-line may use a ferric salt containing pyrene and cyclopentadieny, so that it can be ensured that there is enough photosensitive initiator for UV-light full-exposure solidification after the exposure process by the exposure machine.

According to an embodiment of the invention, there is further provided a manufacturing method of a color filter substrate, in which, the UV curing method as stated above is used as post-curing method of the color filter substrate.

Figure 6:
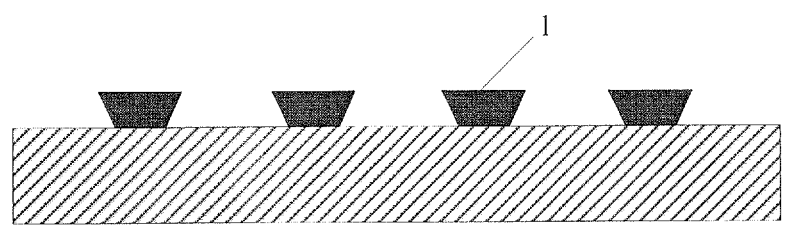
FIG. 6 is a structure sectional view illustrating a BM according to embodiments of the invention, after subjected to a UV curing process.

FIG. 6 is a structurally, schematically sectional view illustrating a BM according to an embodiment of the invention, after the BM is subjected to a UV curing process. Because softening and collapsing of the photoresist will not be caused by the UV curing method, an inverted trapezoid structure of BM is maintained. Thus, the line-width of BM can be restrained from becoming larger, thereby fitting a narrow line-width requirement of a high-resolution display panel on the BM, and the aperture ratio can also be raised.

The exposure process after soft-baking in the course of producing a color filter substrate is aimed at achieving solidification by means of inducing the photoresist to undergo a crosslinking reaction with UV light. Therefore, in embodiments of the invention, by replacing a heat curing mode adopted in a post-curing process with an UV curing process, not only the time period in which a photolithography procedure is executed is shortened, but also the color filter substrate is effectively assured of not being polluted by various volatile substances during its manufacture. Consequently, the quality of color filter substrate can be better guaranteed. Use of an UV curing method will not damage an inverted trapezoidal structure formed after development, so that the inverted trapezoidal structure is maintained. Thus, the BM line-width is restrained from broadening, in favor of production of a BM with narrow line-width.

Embodiments as stated above are merely some embodiments of the invention, but are not used to limit the protection scope of the invention.

This application claims the benefit of priority from Chinese patent application No. 201310409241.7, filed on Sep. 10, 2013, the disclosure of which is incorporated herein in its entirety by reference as a part of the present application.

What is claimed is:

1. A manufacturing method of a color filter substrate, comprising:
    coating photoresist on a substrate to form a photoresist layer, patterning the photoresist layer through exposure and development and executing an ultraviolet curing of the photoresist layer;
    wherein the ultraviolet curing is carried out in a conveyor belt ultraviolet curing machine; a transfer speed, a curing time period and a length of an ultraviolet curing segment of the conveyor belt ultraviolet curing machine meet the following relationship;

the transfer speed=length of the UV curing segment/ the curing time.

2. The manufacturing method claimed as claim 1, wherein the photoresist layer is a black matrix photoresist layer, a red photoresist layer, a green photoresist layer, a blue photoresist layer, or a photoresist layer for pillar-shaped spacers and an ultraviolet irradiation is conducted on the substrate from front and back sides of the substrate, respectively.

3. The manufacturing method claimed as claim 1, wherein the photoresist comprises a photosensitizer sensitive to i-line of ultraviolet light added therein.

4. The manufacturing method claimed as claim 3, wherein the photoresist also comprises a photosensitizer sensitive to h-line or g-line of ultraviolet light added therein.

5. A manufacturing method of a color filter substrate, comprising:
    coating a light-cured material on a substrate to form an overcoat, and executing an ultraviolet curing;
    wherein the ultraviolet curing includes:
    conducting an ultraviolet irradiation on the substrate from front and back sides of the substrate, respectively.

6. The manufacturing method claimed as claim 5, wherein the ultraviolet curing is carried out in a conveyor belt ultraviolet curing machine or an oven ultraviolet curing machine.

7. The manufacturing method claimed as claim 6, wherein, where the conveyor belt ultraviolet curing machine is used for ultraviolet curing of the substrate, a transfer speed, a curing time period and a length of an ultraviolet curing segment meet the following relationship:

the transfer speed=the length of the UV curing segment/the curing time.

8. The manufacturing method claimed as claim 6, wherein the oven ultraviolet curing machine is provided hi a multilayered structure, and at least one ultraviolet light source is arranged between layers.

9. The manufacturing method claimed as claim 5, wherein the light-cured material comprises a photosensitizer sensitive to i-line of ultraviolet light added therein.

10. The manufacturing method claimed as claim 9, wherein, the light-cured material also comprises a photosensitizer sensitive to h-line or g-line of ultraviolet light added therein.

11. A manufacturing method of a color filter substrate, comprising:
- coating a black matrix photoresist on a substrate to form a black matrix photoresist layer, forming a pattern of a black matrix through exposure and development and executing an ultraviolet curing of the black matrix photoresist layer;
- coating a red photoresist on the substrate to form a red photoresist layer, forming pattern of red sub-pixels through exposure and development and executing an ultraviolet curing of the red photoresist layer;
- coating a green photoresist on the substrate to form a green photoresist layer, forming pattern of green sub-pixels through exposure and development and executing an ultraviolet curing of the green photoresist layer; and
- coating a blue photoresist on the substrate to form a blue photoresist layer, forming pattern of blue sub-pixels through exposure and development and executing an ultraviolet curing of the blue photoresist layer;
- wherein the ultraviolet curing is carried out in an oven ultraviolet curing machine; the oven ultraviolet curing machine is provided in a multilayered structure, and at least one ultraviolet light source is arranged between layers.

12. The manufacturing method claimed as claim 11, further comprising:
- coating a light-cured material on the substrate to form an overcoat, and executing an ultraviolet curing.

13. The manufacturing method claimed as claim 12, further comprising:
- coating a pillar-shaped spacer photoresist on the substrate to form a photoresist layer for pillar-shaped spacers, forming a pattern of the pillar-shaped spacers and executing an ultraviolet curing.

14. The manufacturing method claimed as claim 13, further comprising:
- conducting an annealing on the substrate with the black matrix, the red, green and blue sub-pixels, the overcoat and the pillar-shaped spacers formed thereon.

15. The manufacturing method claimed as claim 13, wherein at least one of the black matrix photoresist, the red photoresist, the green photoresist, the blue photoresist, the light-cured material and the pillar-shaped spacer photoresist comprises a photosensitizer sensitive to i-line of ultraviolet light added therein.

16. The manufacturing method claimed as claim 15, wherein at least one of the black matrix photoresist, the red photoresist, the green photoresist, the blue photoresist, the light-cured material and the pillar-shaped spacer photoresist also comprises a photosensitizer sensitive to h-line or g-line of ultraviolet light added therein.

17. The manufacturing method claimed as claim 11, wherein the ultraviolet curing is conducting an ultraviolet irradiation on the substrate from front and back sides of the substrate, respectively.

* * * * *